(12) United States Patent
Soh

(10) Patent No.: US 8,350,596 B1
(45) Date of Patent: Jan. 8, 2013

(54) CLOCK LOSS DETECTION CIRCUIT FOR PLL CLOCK SWITCHOVER

(75) Inventor: Lip Kai Soh, Sitiawan (MY)

(73) Assignee: Altera Corporation, San Jose, CA (US)

( * ) Notice: Subject to any disclaimer, the term of this patent is extended or adjusted under 35 U.S.C. 154(b) by 172 days.

(21) Appl. No.: 12/748,320

(22) Filed: Mar. 26, 2010

(51) Int. Cl.
*H03K 5/19* (2006.01)
(52) U.S. Cl. ........................................... 327/20
(58) Field of Classification Search ............... 327/99, 327/20
See application file for complete search history.

(56) References Cited

U.S. PATENT DOCUMENTS

| 7,750,685 | B1 * | 7/2010 | Bunch et al. | 327/48 |
| 2003/0090296 | A1 * | 5/2003 | Yoo | 327/12 |
| 2007/0030043 | A1 * | 2/2007 | Takai et al. | 327/158 |
| 2008/0054952 | A1 * | 3/2008 | Nozaki | 327/99 |

* cited by examiner

*Primary Examiner* — Lincoln Donovan
*Assistant Examiner* — Daniel Rojas
(74) *Attorney, Agent, or Firm* — Womble Carlyle Sandridge & Rice, LLP

(57) ABSTRACT

A clock loss detection circuit is presented. The clock loss detection has two edge detection circuits and a clock loss detect counter circuit. Each edge detection circuit includes a reset signal circuit that generates a reset signal in response to a transition of a clock signal, and the reset signal circuit is connected to a clock input of the edge detection circuit. Each edge detection circuit also has a multiplexer connected to the reset signal circuit, and another multiplexer connected to the clock input. The clock loss detect counter circuit is connected to the edge detection circuits so that the clock loss detect counter circuit receives the reset signal from the second edge detection circuit and the clock signal from the first edge detection circuit.

23 Claims, 7 Drawing Sheets

CLOCK LOSS DETECTION CIRCUIT FOR PLL CLOCK SWITCHOVER

BACKGROUND

Phase-locked loop (PLL) circuits are used in a variety of radio, telecommunications, computers, and other electronic applications. PLL clock switchover is a mechanism that enables a backup clock to clock the phase-locked loop in the event the primary clock to the PLL stops functioning in order to ensure reliability of PLL systems. The use of a phase-locked loop clock switchover creates more reliable systems compared to systems that does not support switchover, especially in networking systems.

Typically PLL clock switchover is implemented using a clock loss detection circuit. The clock loss detection circuit can introduce glitches in the output signal due to the combination of the circuit path and possible clock skew introduced into the clock loss detection circuit. These glitches can be interpreted by the PLL circuit to be a clock loss signal, which in turn can trigger a false clock switchover by the PLL. In other words, the phase-locked loop can unintentionally switch to the backup clock at times when the primary clock is still functional. The probability of these glitches occurring increases as designs are ported to more advanced process technologies that have increased process, temperature, and voltage variations. In addition, the complexity of typical clock switchover circuit designs contributes to slower response time, which in turn translates to lower maximum operating frequency.

It is in this context that embodiments of the invention arise.

SUMMARY

Broadly speaking, the present invention fills these needs by providing a method and apparatus for triggering a clock switchover in a phase-locked loop circuit. In one embodiment, a clock loss detection circuit with a forward reset path prevents glitches in a clock loss signal and eliminates false clock switchover. It should be appreciated that the present invention can be implemented in numerous ways, including as a method, a system, or a device. Several inventive embodiments of the present invention are described below.

In accordance with one aspect of the invention, a clock loss detection circuit is detailed. The clock loss detection has two edge detection circuits and two clock loss detect counter circuits. Each edge detection circuit includes a reset signal circuit that generates a reset signal in response to a transition of a clock signal. The reset signal circuit is connected to a clock input of the edge detection circuit. Each edge detection circuit also has a multiplexer connected to the reset signal circuit, and another multiplexer connected to the clock input. The clock loss detect counter circuit is connected to the edge detection circuits, so that the clock loss detect counter circuit receives the reset signal from the second edge detection circuit and the clock signal from the first edge detection circuit.

In accordance with another aspect of the invention, a method of minimizing false clock switchover is provided. The method begins by receiving a first and second clock signal, and a clock loss signal. The method then generates a reset signal in response to a transition of the second clock signal. A clock loss signal is then propagated through a series of sequential storage elements when consecutive voltage pulses of the reset signal are undetected. Transmitting the clock loss signal from the series of sequential storage elements causes a clock switchover from the second clock signal to the first clock signal.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings.

DETAILED DESCRIPTION

The following embodiments describe an apparatus and method for minimizing false clock switchover of phase-locked loop (PLL) circuits using a clock loss detection circuit with a forward reset path. It will be obvious, however, to one skilled in the art, that the present invention may be practiced without some or all of these specific details. In other instances, well known process operations have not been described in detail in order not to unnecessarily obscure the present invention. Embodiments described below prevent false clock switchover in the PLL circuits by eliminating the glitch in the clock loss signal of a clock loss circuit. In addition, embodiments of the present invention can operate at a higher frequency compared to conventional implementations due to the use of a forward reset path that is implemented using fewer logic gates and a shorter reset path.

Figure 1:
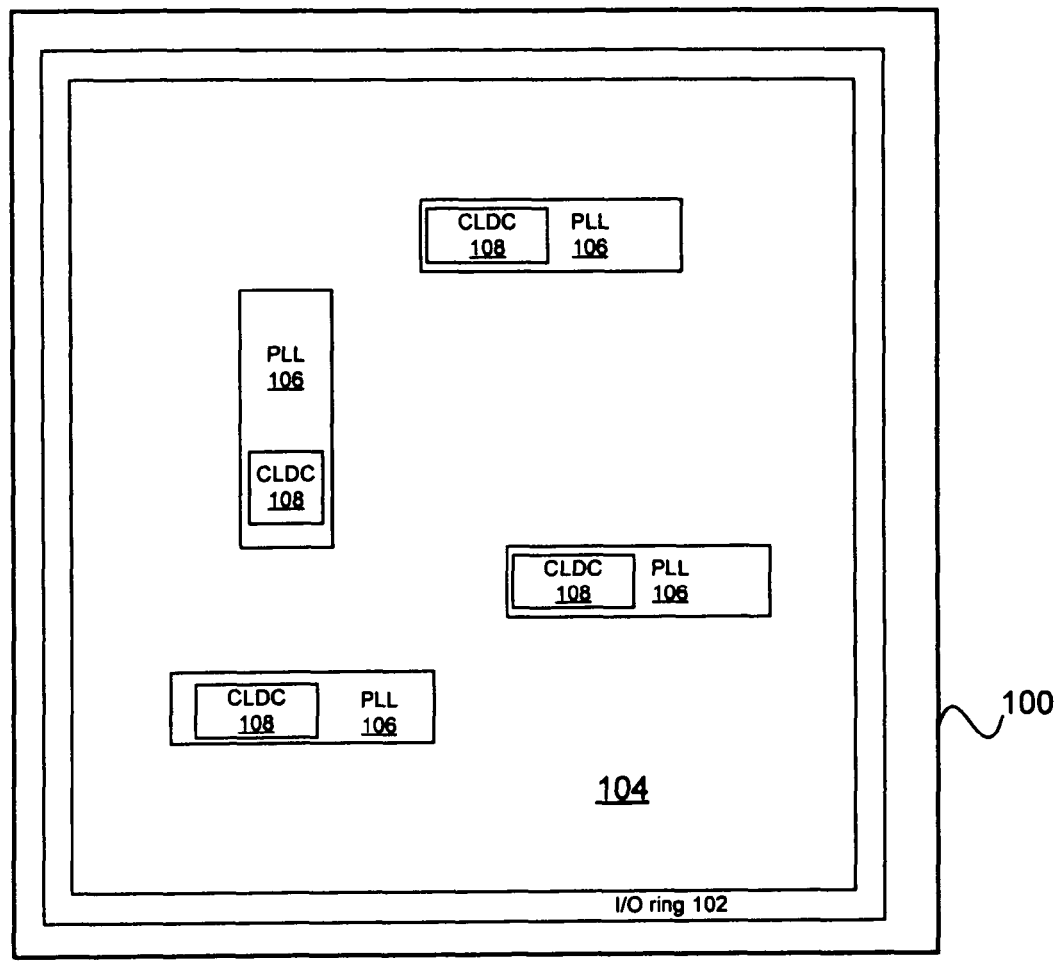
FIG. 1 illustrates a top view of an integrated circuit utilizing a clock loss detection circuit, in accordance with one embodiment of the present invention.

FIG. 1 illustrates a top view of an integrated circuit utilizing a clock loss detection circuit, in accordance with one embodiment of the present invention. In an integrated circuit 100, such as a processor or a programmable logic device (PLD), including field-programmable gate arrays (FPGAs), the input/output (I/O) ring 102 has bonding pads (not shown) which provide input signals and power to the circuits of the core logic 104, as well as transmit output signals from the core logic 104. A number of phase-locked loop circuits 106 can be distributed within the core logic 104 or in the I/O ring 102 of the integrated circuit 100. For illustrative purposes, the PLL circuits 106 within the core logic 104 are not drawn to scale. A clock loss detection circuit (CLDC) 108 is often a key component of the PLL circuits 106, which as discussed previously, provides a mechanism to trigger switching of the PLL circuit 106 to a backup clock in the event a primary clock fails. The clock loss detection circuit 108 is a sub-circuit of a PLL circuit 106 in one embodiment.

Figure 2A:
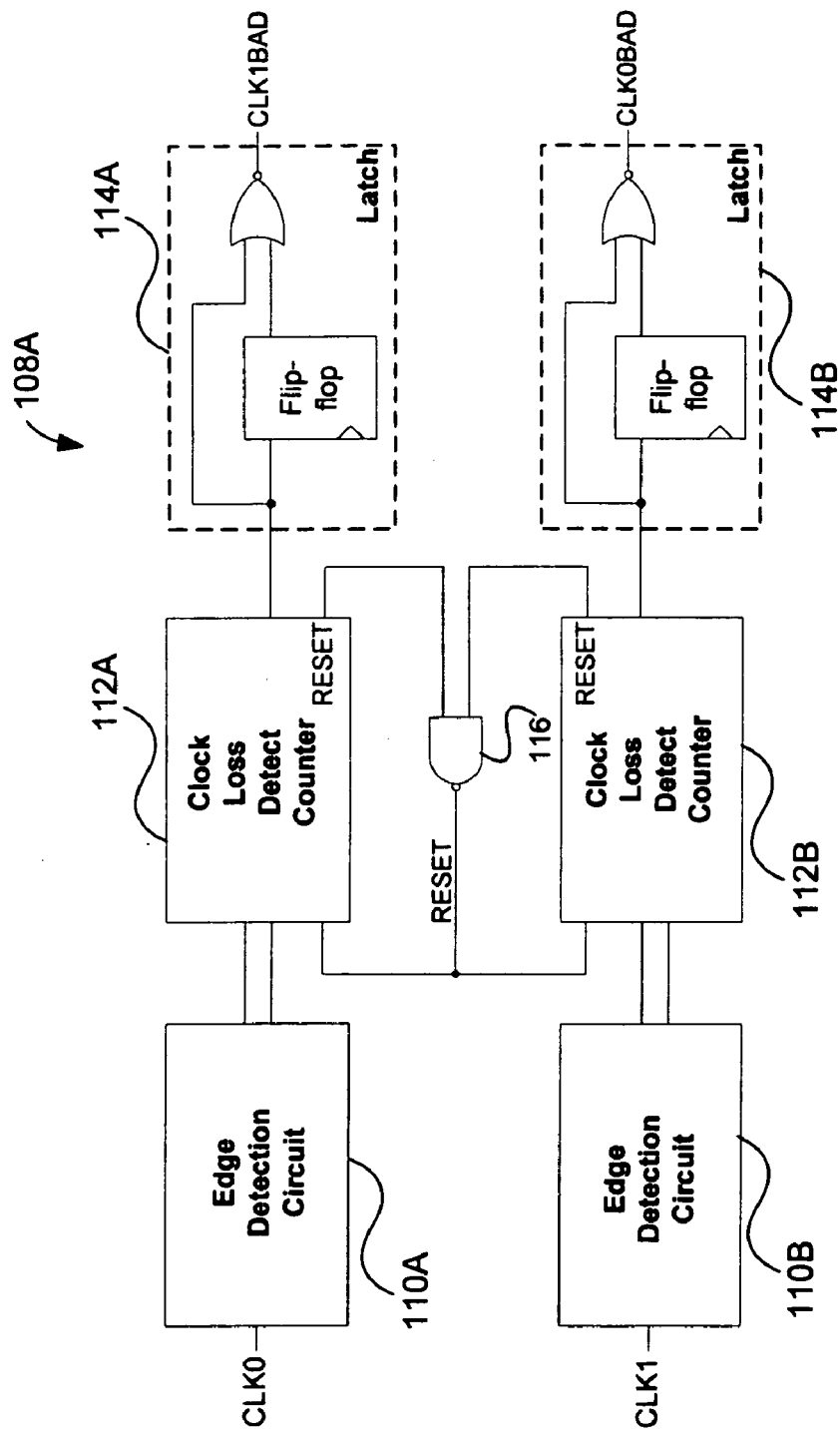
FIG. 2A illustrates a high-level schematic of a clock loss detection circuit, in accordance with one embodiment of the present invention.

FIG. 2A illustrates a high-level schematic of a clock loss detection circuit, in accordance with one embodiment of the present invention. As discussed above, the clock loss detection circuit 108A detects when the primary clock CLK0 fails and sends a clock loss signal to trigger the PLL switchover mechanism. The clock loss detect circuit 108A includes a symmetric pair of edge detection circuits 110A and 110B coupled to corresponding clock loss detect counter circuit 112A and 112B. The primary clock CLK0 of the PLL is coupled to one of the edge detection circuits 110A, while the backup clock CLK1 is coupled to the remaining edge detection circuit 110B. It is well known in the art that the function of the primary clock CLK0 and the backup clock CLK1 is interchangeable. A clock loss signal from respective clock loss detect counter circuits 112A and 112B is transmitted to corresponding latch circuits 114A and 114B. A reset signal from each clock loss detect counter circuit 112A and 112B is transmitted to a reset path logic 116, which also provides feedback to the clock loss detect counter circuits 112A and 112B. For illustrative purposes, the reset path logic 116 is simplified to a NAND gate. One skilled in the art will appreciate that alternate gate level implementations are possible to achieve the functionality described herein.

Figure 2B:
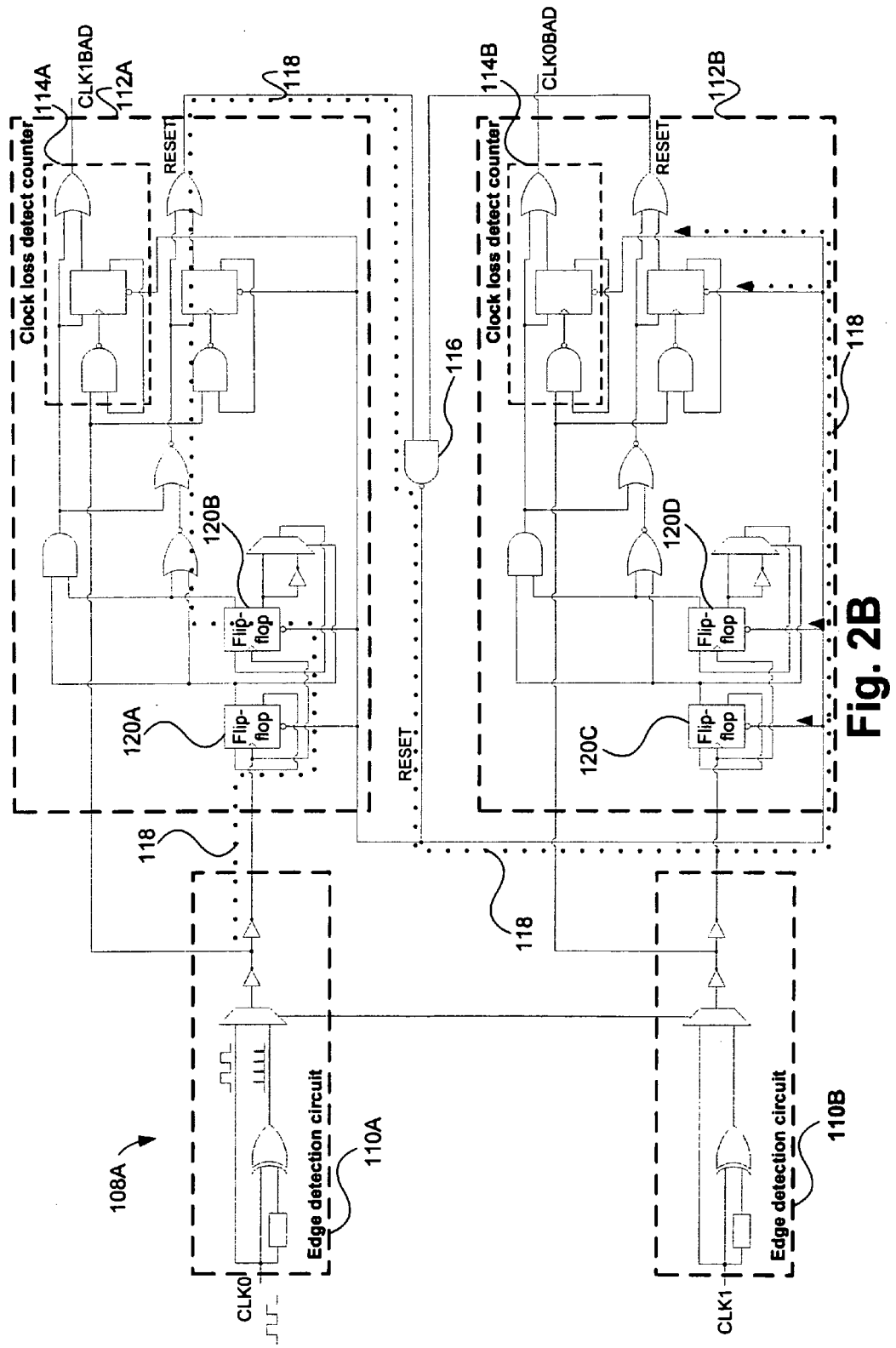
FIG. 2B illustrates a gate-level schematic of a clock loss detection circuit, in accordance with one embodiment of the present invention.

FIG. 2B illustrates a gate-level schematic of a clock loss detection circuit, in accordance with one embodiment of the present invention. In clock loss detection circuit 108A, the reset path 118 for the primary clock CLK0 is transmitted by the edge detection circuit 110A to divider registers 120A and 120B of the clock loss detect counter circuit 112A for clock CLK0, and through to the clock loss detect counter circuit 112B of clock CLK1. Similarly, the reset path for the backup clock CLK1 is transmitted by the edge detection circuit 110B to divider registers 120C and 120D of clock loss detect counter circuit 112B of clock CLK1, and through to the clock loss detect counter 112A of clock CLK0. Clock skew of the reset path 118 can be introduced through the divider registers 120C and 120D of the clock loss detect counter circuit 112B for clock CLK1. Clock skew in the reset path 118 may be caused by process variations affecting the divider registers 120C and 120D, as well as the physical variation in the path length the clock loss signal travels after being clocked through the divider registers 120C and 120D. Because the reset path 118 for clock CLK0 is transmitted to the divider registers 120C and 120D of the clock loss detection counter circuit for clock CLK1, it is possible for a glitch to be introduced to the clock loss signal due to clock skew in the reset path 118. The clock skew of the reset path 118 may be introduced by the divider registers 120C and 120D. Severe glitches in the clock loss signal can in turn trigger false clock switchover from the primary clock CLK0 to the backup clock CLK1.

Figure 3A:
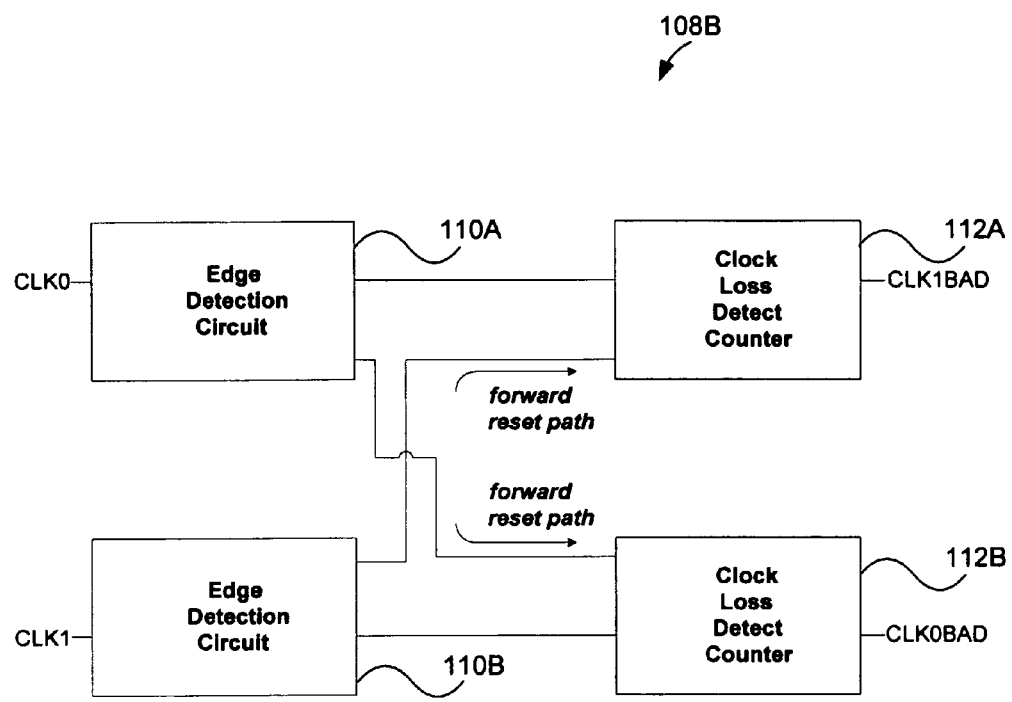
FIG. 3A illustrates a high-level schematic of a clock loss detection circuit with a forward reset path, in accordance with one embodiment of the present invention.

FIG. 3A illustrates a high-level schematic of a clock loss detection circuit with a forward reset path, in accordance with one embodiment of the present invention. A clock loss detection circuit 108B that eliminates glitches in clock loss signal is advantageous for the reasons discussed previously. Rather than having the reset path with feedback to the clock loss detect counter circuits 112A and 112B, as illustrated in FIG. 2A, the clock loss detection circuit 108B has a forward reset path. A forward reset path routes the reset signal of the clock loss detect counter circuit 112B from the edge detection circuit 110A of the primary clock CLK0 to the clock loss detect counter circuit 112B of the backup clock CLK1. The forward reset path of the backup clock CLK1 is similarly routed between the edge detection circuit 110A of the backup clock CLK1 to the clock loss detect counter circuit 112A of the primary clock CLK0. In contrast to the embodiment of FIG. 3A, the feedback reset path of FIG. 2A transmits the reset signal back to the clock loss detect counter circuits 112A and 112B. Thus, as will be described below the embodiment of FIG. 3A improves the embodiment of FIG. 2A by removing possible clock skew introduced by the divider registers.

Figure 3B:
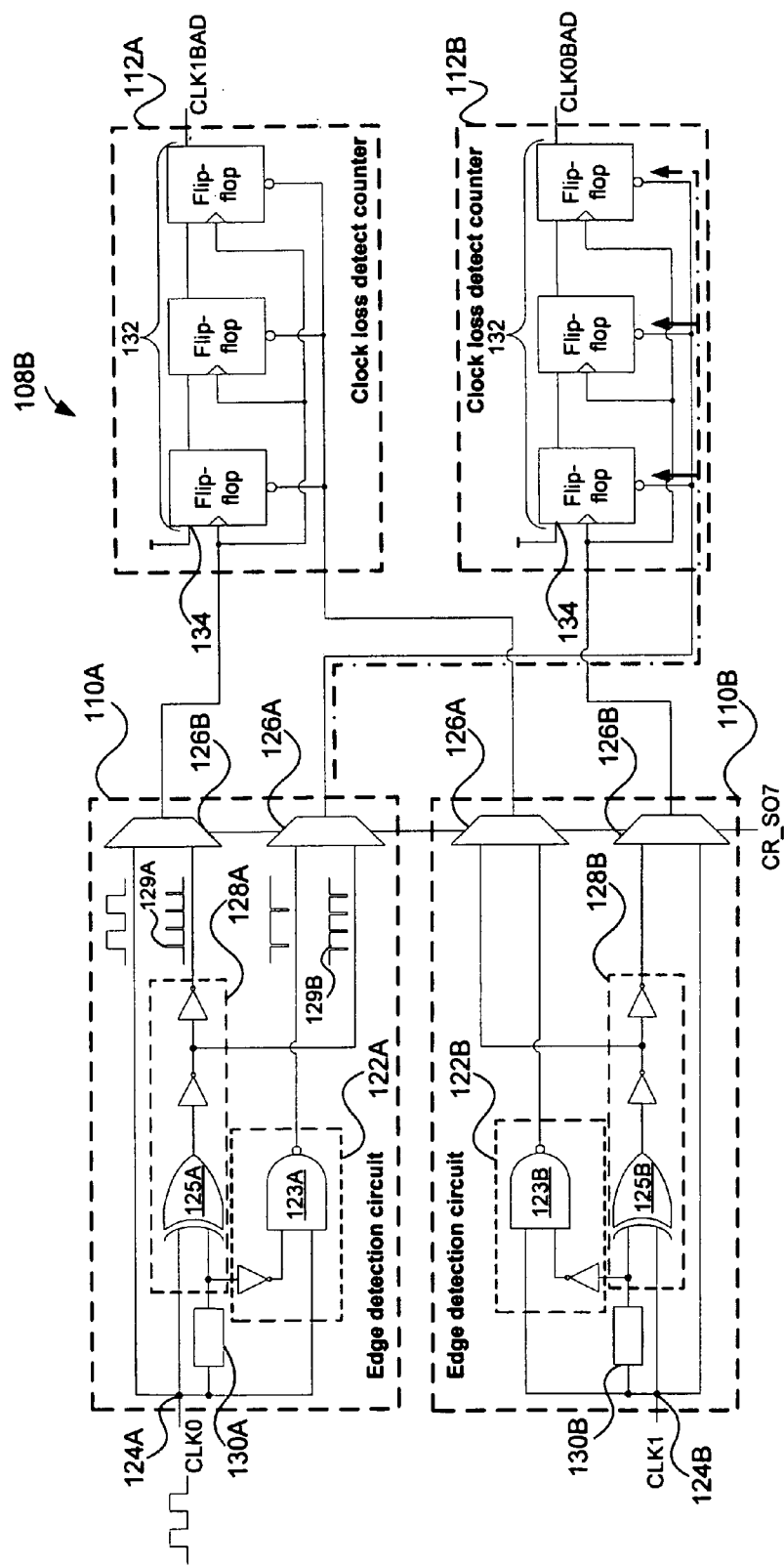
FIG. 3B illustrates a gate-level schematic of a clock loss detection circuit with a forward reset path, in accordance with one embodiment of the present invention.

FIG. 3B illustrates a gate-level schematic of a clock loss detection circuit with a forward reset path, in accordance with one embodiment of the present invention. Each edge detection circuit 110A and 110B of the clock loss detection circuit 108B has a reset signal circuit 122A and 122B that is coupled to a corresponding clock input 124A and 124B. The reset signal circuit 122A and 122B of corresponding edge detection circuits 110A and 110B generate a reset signal in response to a transition of the primary and backup clock signals, CLK0 and CLK1, respectively. In one embodiment, the reset signal is a sequence of voltage pulses that correspond to either a rising or falling transition of the clock signal of the clock signal. In another embodiment, the reset signal circuit 122A and 122B can be implemented as a NAND gate 123A and 123B coupled to the clock input 124A and 124B and a delay circuit 130A and 130B. The delay circuits 130A and 130B provide a delayed version of the clock signal CLK0 and CLK1. One skilled in the art will appreciate that delay circuit 130A and 130B can be a series of buffers or some other suitable delay element.

Each edge detection circuit 110A and 110B has a corresponding pulse circuit 128A and 128B coupled to the clock input 124A and 124B of the edge detection circuits 110A and 110B, respectively. Pulse circuit 128A generates a pulse clock signal 129A and a pulse reset signal 129B in response to the transition of the clock CLK0. In one embodiment, the pulse clock signal 129A has a voltage pulse corresponding to each transition of the clock CLK0, and the pulse reset signal 129B is a sequence of voltage pulses that correspond to each transition, i.e., rising and falling, of CLK0. One skilled in the art will appreciate that pulse circuit 128B functions similarly with respect to the transition of CLK1. In one embodiment, the pulse circuits 128A and 128B can be implemented using an XOR gate 125A and 125B and corresponding inverters. Still further, the pulse clock signal and the pulse reset signal have the opposite polarity of the clock signals CLK0 and CLK1, in one embodiment. The edge detection circuits 110A and 110B further include a reset multiplexer (MUX) 126A that is coupled to the corresponding reset signal circuit 122A and 122B and the corresponding pulse circuit 128A and 128B. A clock multiplexer 126B is coupled to the clock input 124A and 124B of the corresponding edge detection circuit and the corresponding pulse circuit 128A and 128B. The clock multiplexer 126B selects either the clock signal CLK0 or CLK1 at the clock input 124A and 124B or the pulse clock signal from the pulse circuit 128A and 128B. The reset multiplexer 126A selects either the reset signal from the reset signal circuit 122A and 122B or the pulse reset signal 129B from the pulse circuit 128A and 128B. In one embodiment, the selection of the signals to be transmitted by the reset MUX 126A and the clock MUX 126B is a configuration random-access memory (CRAM) bit that is transmitted to each of the multiplexers 126A and 126B. Still further, the CRAM bit controls whether the edge detection circuit 110A and 110B responds to the rising transitions of clocks CLK0 and CLK1 or the rising and falling transitions of the clocks CLK0 and CLK1.

The clock loss detection circuit 108B further includes clock loss detect counter circuits 112A and 112B, each of which are coupled to corresponding edge detection circuit 110A and 110B. The clock loss detect counter circuit 112A for clock CLK0 receives a clock signal from the edge detection circuit 110A of CLK0 and a reset signal from the edge detection circuit 110B of clock CLK1. The clock loss detect counter circuit 112B for clock CLK1 is connected in similar fashion to the clock loss detect counter circuit 112A for clock CLK0, with the clock signal being received from the edge detection circuit 110B of clock CLK1. In addition, the reset signal for the clock loss detect counter circuit 112B is received from the edge detection circuit of clock CLK0 110A.

In one embodiment, the clock loss detect counter circuits 112A and 112B can be implemented using cascaded sequential storage elements 132. In one embodiment, the cascaded sequential storage elements 132 are implemented using flip-flops. The flip-flops can be negative edge flip-flops in one embodiment. This is contrasted with the use of the clock divider structure in the clock loss detect counter circuits 112A and 112B of FIG. 2B. One with skill in the art will appreciate the cascaded sequential storage element 132 structure reduces the amount of logic used to implement the clock loss detect counter circuits 112A and 112B. The cascaded sequential storage element structure 132 of each clock loss detect counter circuit 112A and 112B has a clock loss signal input 134 that receives the clock loss signal. In one embodiment, the clock loss signal is generated by a voltage source. One with skill in the art will appreciate glitches in the clock loss signal are prevented because the clock loss signal is gated by the three cascaded flip-flops 132.

The cascaded flip-flop structure, of the clock CLK0 clock loss detect counter circuit 112A receives the clock signal from the clock MUX 126B of the CLK0 edge detection circuit 110A. The reset signal is received from the reset MUX 126A of the CLK1 edge detection circuit 110B. The clock loss signal received at the clock loss input 134 is propagated through the cascaded sequential storage element structure when consecutive voltage pulses of the reset signal are undetected by the clock loss detect counter circuits 112A and 112B. In other words, the contents of the sequential storage elements 132 are cleared in response to voltage pulses of the reset signal.

Still referring to FIG. 3B, the clock loss detect counter circuit 112B for clock CLK1 works in a similar fashion, except the clock signal is received by the clock MUX 126B of the edge detection circuit 110B, and the reset signal is received by the reset MUX 126A of the edge detection circuit 110A. When a phased-lock loop clock switchover circuit detects a clock loss signal from the clock loss detection circuit 108B, the PLL switches over from either the primary clock CLK0 to the backup clock CLK1, or from the backup CLK1 to the primary clock CLK0. In one embodiment, the PLL clock switchover circuit that receives the clock loss signal from the clock loss detection circuit 108B is integrated into the PLL. While specific gate-level implementations of the edge detection circuit 110A and 110B, and the clock loss detect counter circuit 112A and 112B are provided for illustrative purposes, these implementations are not limiting, as one skilled in the art will appreciate that alternative gate level implementations are possible to achieve the functionality described herein.

Figure 4:
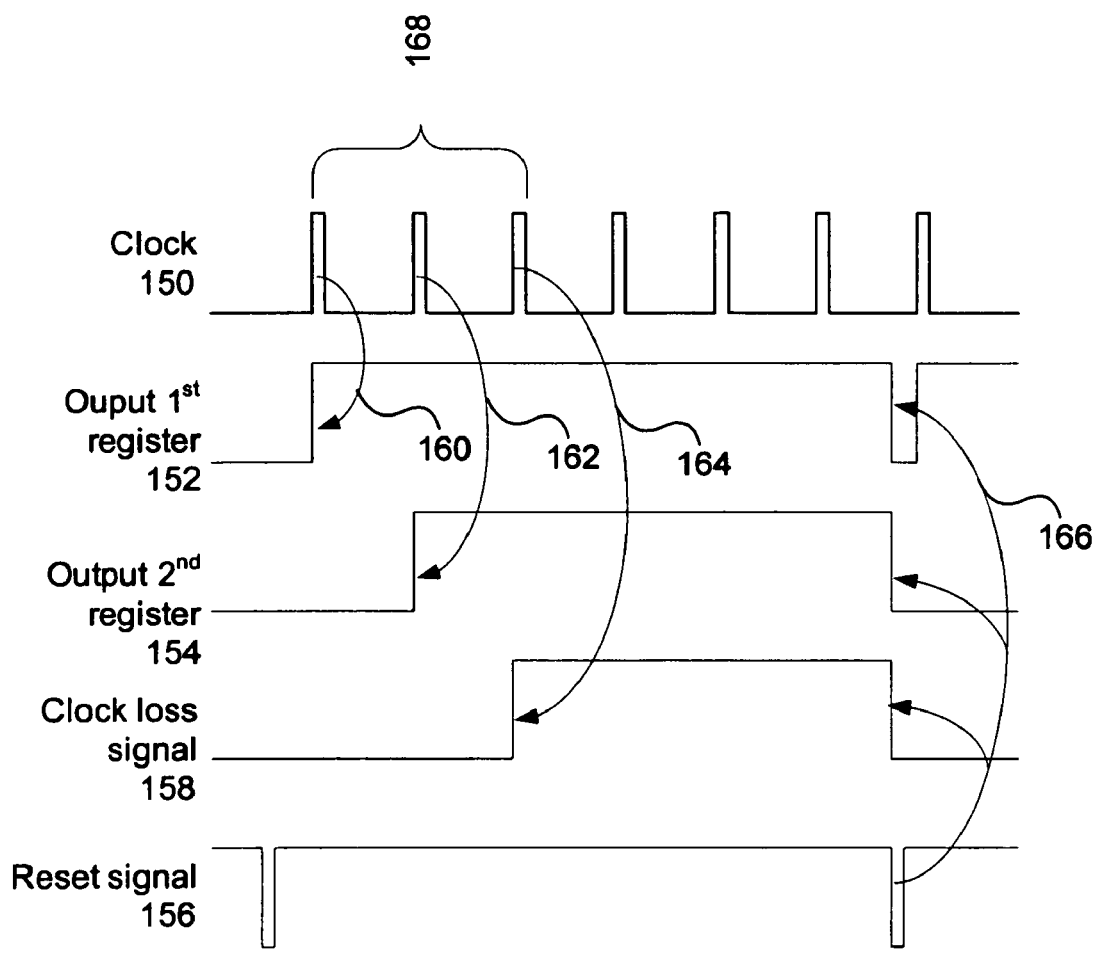
FIG. 4 illustrates a timing diagram for the clock loss detection circuit, in accordance with one embodiment of the present invention.

FIG. 4 illustrates a timing diagram for the clock loss detection circuit, in accordance with one embodiment of the present invention. The edge detection circuits of the clock loss detection circuit are configured to receive a clock signal 150, e.g. clock CLK0 or clock CLK1. As discussed above in relation to FIG. 3B, each of the edge detection circuits receives a clock signal 150 and transmits the clock signal 150 to a corresponding clock loss detect counter circuit. In one embodiment, the CRAM bit received by the clock MUX selects either a short pulse clock or the clock input 150, as discussed with reference to FIG. 3B.

A clock voltage pulse received by the clock loss detect counter circuit causes data at the input of each sequential storage element to be propagated to the next sequential storage element. Waveform 152 illustrates the output of the first sequential storage element, where the output of the first sequential storage element transmits a logic "1" in response to a rising transition of the clock signal 150, as indicated by arrow 160. Waveform 154 illustrates the output of the second sequential storage element, where as indicated by arrow 162, the data from the first sequential element is propagated through the second sequential storage element in response to the second rising transition of the clock signal 150. Arrow 164 indicates the clock loss signal 158 is transmitted in response to the rising transition of the third voltage pulse of the clock signal 150. In one embodiment, the clock loss signal is provided by a voltage source and the sequential storage elements are negative edge flip-flops.

When a voltage pulse of the reset signal 156 is detected by the clock loss detect counter circuit, the contents of each sequential storage element are cleared. In one embodiment, as indicated by arrow 166 and waveforms 152, 154, and 156, detecting a falling transition of the reset signal 156 causes the output of the sequential storage elements to change from logic "1" to logic "0". Although FIG. 4 illustrates a negative reset pulse, the embodiments may include a positive reset pulse. It should be appreciated that detection of a transition from either a high to low or low to high state is included by the embodiments and the direction of the transition is not critical.

In another embodiment, the reset signal 156 consists of negative voltages pulses generated when the edge detection circuit of FIG. 3B detects a transition in the clock signal 150. In yet another embodiment, the CRAM bit that selects the clock signal 150 as the output of the clock MUX also selects the reset signal 156 of the reset MUX that outputs a voltage pulse whenever the reset signal circuit detects a transition in the backup clock signal, as discussed in regard to FIG. 3B. Still further, the reset signal 156 is a series of voltage pulses that are generated in response to a transition of the backup clock signal. As discussed above, the clock signal and the backup clock signal are interchangeable.

Therefore, if the backup clock signal fails and a voltage pulse of the reset signal 156 is undetected within a predetermined number of clock cycles 168 of the clock signal 150, the clock loss signal 158 is propagated through the cascaded sequential storage elements. Failure of the backup clock signal is manifested as an absence of consecutive voltage pulses in the reset signal 156 over a pre-determined number of clock cycles 168 of the clock signal 150. When the failure of the backup clock occurs, the clock loss signal 158 is transmitted by the clock loss detect counter circuit. One with skill in the art will appreciate the number of consecutive clock cycles 168 of the clock signal 150 required to propagate the clock loss signal 158 through the sequential storage elements is determined by the number of sequential storage elements in the clock loss detect counter circuit, in one embodiment. In other words, if the clock loss detect counter circuit has three sequential storage elements, as illustrated in FIG. 3B, the clock loss signal 156 is transmitted after three clock cycles of the clock signal 150. As discussed above in reference to FIG. 3B, transmitting the clock loss signal 158 to the PLL clock switchover circuit triggers the PLL clock switchover circuit to switch from the backup clock signal to the clock signal 150.

Detecting a failure in the backup clock signal works in similar fashion to the timing diagram of FIG. 4 described above. The clock loss detection behavior for clock signal 150 can be understood by substituting the backup clock signal for the clock signal 150, and the reset signal 156 as being generated in response to the clock signal 150. As illustrated in FIG. 3B, the backup clock signal is received by the edge detection circuit of the backup clock signal and the backup clock signal is transmitted from the edge detection circuit to the clock loss detect counter circuit. As discussed above, the edge detection circuit of the clock signal 150 generates the reset signal 156 in response to a transition of the clock signal 150. In one embodiment, after the first voltage pulse of the backup clock signal is received by the clock loss detect counter circuit, the clock loss signal is propagated from the first sequential storage element unless a voltage pulse of the reset signal 156 from the edge detection circuit of the clock signal 150 is detected. Similarly, the output from the second sequential storage element is propagated after receiving the second voltage pulse of the backup clock signal, unless a voltage pulse of the reset signal 156 from the edge detection circuit of the clock signal 150 is detected. If the voltage pulse of the reset signal 156 is undetected during a specified number of consecutive clock cycles of the backup clock signal, then the clock loss signal 158 is propagated from the clock loss detect counter circuit of the backup clock signal.

In one embodiment, the CRAM bit can configure the clock loss detection circuit to respond to both rising and falling transitions of the clock signal 150. In this configuration, the edge detection circuit transmits a voltage pulse when either a rising or falling transition in the clock signal 150 is detected. This embodiment also configures the reset signal circuit to transmit a voltage pulse in response to either rising or falling transition of the clock signal 150. The operation of the clock loss detection circuit in this configuration is the same as described above in reference to FIG. 4.

Figure 5:
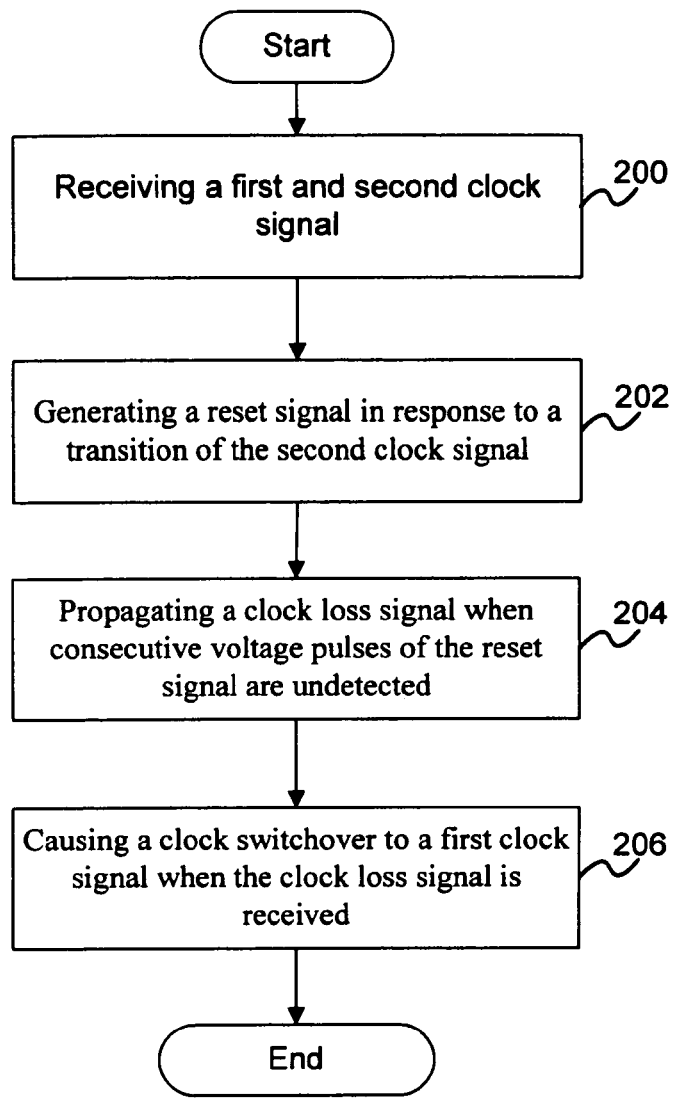
FIG. 5 is a flow chart diagram illustrating method operations for minimizing false clock switchover in phase-locked loop circuits, in accordance with one embodiment of the present invention.

FIG. 5 is a flow chart diagram illustrating method operations for minimizing false clock switchover in phase-locked loop circuits, in accordance with one embodiment of the present invention. The method starts in operation 200, in which the clock loss detection circuit receives a first and second clock signal. In one embodiment, one of the clocks is a primary clock and other clock is a backup clock. Still further, the primary clock has a different frequency than the backup clock, in one embodiment. For proper operation of the clock loss detection circuit, the frequency of the primary clock should be within a multiple of the frequency of the backup clock, where the multiple of the frequency is equal to the number of storage elements of the clock loss detect counter circuit. In other words, if the clock loss detect counter circuit included three sequential storage elements, then the primary clock should have a frequency that is within three times the frequency of the backup clock signal.

The method advances to operation 202, in which a reset signal is generated in response to a transition of the second clock. As illustrated in FIG. 3B, the edge detection circuit of the backup clock generates a voltage pulse in response to a transition in the backup clock. In one embodiment, as illustrated in FIG. 3B, the edge detection circuit transmits a negative voltage pulse in response to the transition of the clock signal to negative edge flip-flops of the clock loss detect counter circuit. In operation 204, the clock loss signal is propagated when consecutive clock pulses are undetected. As discussed in reference to FIG. 4, when the clock loss detect counter circuit detects a voltage pulse of the reset signal, the clock loss signal is not transmitted by the clock loss detect counter circuit. In one embodiment, the clock loss signal is provided by a voltage source. Operation 206 causes a clock switchover from the second clock to the first clock when the clock loss signal is received by the PLL clock switchover circuit. In one embodiment, the clock loss signal is transmitted by the clock loss detect counter circuit after a specified number of consecutive clock cycles. Still further, as illustrated in FIG. 3B, the number of consecutive clock cycles is determined by the number of sequential storage elements included in the clock loss detect counter circuit, in one embodiment.

The method and apparatus described herein may be incorporated into any suitable circuit, including processors and programmable logic devices (PLDs). The PLDs can include programmable array logic (PAL), programmable logic arrays (PLAs), field programmable logic array (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the PLDs owned by ALTERA CORPORATION.

The invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

The embodiments of the present invention can also be defined as a machine that transforms data from one state to another state. The transformed data can be saved to storage and then manipulated by a processor. The processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A clock loss detection circuit, comprising:
   a first edge detection circuit including a first reset signal circuit coupled to a first clock input, the first reset signal circuit operable to generate a first reset signal in response to a transition of a first clock signal, the first edge detection circuit including a first multiplexer coupled to the first reset signal circuit, and a second multiplexer coupled to the first clock input;
   a second edge detection circuit including a second reset signal circuit coupled to a second clock input, wherein the second reset signal circuit is decoupled from the first clock input, the second reset signal circuit operable to generate a second reset signal in response to a transition of a second clock signal; and
   a first clock loss detect counter circuit coupled to the first edge detection circuit and the second edge detection circuit, the first clock loss detect counter circuit operable to receive the reset signal from the second edge detection circuit and the first clock signal of the first edge detection circuit.

2. The clock loss detection circuit of claim 1, further comprising:
   a second clock loss detect counter circuit coupled to the first and second edge detection circuit, the second clock loss detect counter circuit operable to receive the first reset signal, a clock signal of the second edge detection circuit wherein the second clock loss detect counter circuit is operable to transmit a clock loss signal triggering a clock switchover to a second clock signal.

3. The clock loss detection circuit of claim 1, further comprising:
   a pulse circuit coupled to the first clock input, the pulse circuit operable to generate a pulse clock signal and a pulse reset signal in response to the transition of the clock signal.

4. The clock loss detection circuit of claim 1, wherein the clock loss detection counter circuit further comprises:
   a plurality of flip-flops propagating a clock loss signal therethrough when consecutive voltage pulses of the reset signal are undetected.

5. The clock loss detection circuit of claim 1, wherein the reset circuit further comprises:
   a NAND gate coupled to the first clock input and a delayed version of the first clock signal.

6. The clock loss detection circuit of claim 3, wherein the pulse circuit further comprises:
   an XOR gate coupled to the first clock input and a delayed version of the first clock signal.

7. The clock loss detection circuit of claim 3, wherein a delayed version of the first clock signal is provided to the first reset signal circuit and the pulse circuit.

8. The clock loss detection circuit of claim 3, wherein the first reset signal is a plurality of voltage pulses corresponding to a transition of the first clock signal and the pulse reset signal is a plurality of voltage pulses corresponding to each transition of the first clock signal.

9. The clock loss detection circuit of claim 1, wherein the first clock signal received by the first edge detection circuit has a different frequency than the second clock signal received by the second edge detection circuit.

10. A clock loss detection circuit with a plurality of sequential storage elements, comprising:
    a first edge detection circuit and a second edge detection circuit, the first edge detection circuit including a first reset signal circuit that generates a reset signal in response to a transition of a first clock signal, the second edge detection circuit including a second reset signal circuit that generates a second reset signal in response to a transition of a second clock signal; and
    a first clock loss detect counter circuit coupled to the first edge detection circuit and the second edge detection circuit, the first clock loss detect counter circuit having a first plurality of sequential storage elements for propagating a clock loss signal through the first plurality of sequential storage elements when consecutive voltage pulses of the second reset signal are undetected for a number of clock cycles, thereby triggering a clock switchover from the first clock signal to the second clock signal, wherein the second edge detection circuit is decoupled from the first clock signal.

11. The clock loss detection circuit of claim 10, further comprising:
    a second clock loss detect counter circuit that receives the clock signal from the second edge detection circuit and the reset signal from the first edge detection circuit, the clock loss signal received by the second clock loss detect counter circuit propagates through a second plurality of sequential storage elements when consecutive voltage pulses of the reset signal from the first edge detection circuit are undetected.

12. The clock loss detection circuit of claim 10, wherein the first plurality of sequential storage elements further comprises:
    a plurality of negative edge flip-flops.

13. The clock loss detection circuit of claim 10, wherein the edge detection circuits further comprise:
    a pulse circuit operable to generate a pulse clock signal and a pulse reset signal in response to the transition of the clock signal, wherein the pulse clock signal and the pulse reset signal have an opposite polarity to the clock signal.

14. The clock loss detection circuit of claim 13, wherein the edge detection circuit further comprises:
   a first multiplexer and a second multiplexer, the first multiplexer operable to select one of the clock signal or the pulse clock signal, and the second multiplexer operable to select one of the reset signal or the pulse reset signal.

15. The clock loss detection circuit of claim 14, wherein the edge detection circuit further comprises:
   a configuration random-access memory bit selecting output for the first multiplexer and the second multiplexer.

16. The clock loss detection circuit of claim 11, wherein the clock loss detect counter circuit further comprises:
   a clock loss signal input coupled to a voltage source.

17. A method of minimizing false clock switchover, comprising:
   receiving a first clock signal, a second clock signal and a clock loss signal;
   generating a reset signal in response to a transition of the second clock signal;
   propagating a clock loss signal through a plurality of sequential storage elements when consecutive voltage pulses of the reset signal are undetected, wherein each storage element of the plurality of sequential storage elements receives the reset signal; and
   causing a clock switchover to the first clock signal in response to transmission of the clock loss signal from the plurality of sequential storage elements.

18. The method of minimizing false clock switchover of claim 17, further comprising:
   generating a secondary reset signal in response to the transition of the first clock signal;
   propagating a secondary clock loss signal through a plurality of secondary sequential storage elements when consecutive voltage pulses of the secondary reset signal are undetected; and
   causing a clock switchover to the second clock signal in response to transmission of the secondary clock loss signal from the plurality of secondary sequential storage elements.

19. The method of minimizing false clock switchover of claim 17, further comprising:
   transmitting the first clock signal to the plurality of sequential storage elements.

20. The method of minimizing false clock switchover of claim 17, further comprising:
   clearing contents of the plurality of sequential storage elements in response to detecting voltage pulses of the reset signal.

21. The method of minimizing false clock switchover of claim 17, further comprising:
   generating a pulse clock signal having a voltage pulse corresponding to each transition of the clock signal.

22. The method of minimizing false clock switchover of claim 18, further comprising:
   selecting one of the clock signal or the pulse clock signal.

23. The method of minimizing false clock switchover of claim 17, further comprising:
   delaying the clock signal to specify a width of voltage pulses of the reset signal.

* * * * *